United States Patent
Chen et al.

(10) Patent No.: US 9,629,291 B1
(45) Date of Patent: Apr. 18, 2017

(54) ELECTRONIC DEVICE AND RISER CARD ROTATING MODULE

(71) Applicant: Wistron Corporation, New Taipei (TW)

(72) Inventors: Jhih-Ming Chen, New Taipei (TW);
Yu-Ting Huang, New Taipei (TW);
Chi-Jen Lo, New Taipei (TW);
Meng-Chian Shiu, New Taipei (TW);
Chia-Hsiung Hsueh, New Taipei (TW);
Chieh-Jo Wang, New Taipei (TW);
Hsin-Tien Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/006,132

(22) Filed: Jan. 26, 2016

(30) Foreign Application Priority Data

Nov. 6, 2015 (TW) .............................. 104136579 A

(51) Int. Cl.
*H05K 1/14* (2006.01)
*H05K 13/04* (2006.01)
*G06F 1/18* (2006.01)
*G06F 1/16* (2006.01)

(52) U.S. Cl.
CPC ............. *H05K 13/04* (2013.01); *G06F 1/185* (2013.01); *H05K 13/0486* (2013.01); *G06F 1/16* (2013.01); *G06F 1/184* (2013.01); *G06F 1/186* (2013.01); *G06F 1/187* (2013.01)

(58) Field of Classification Search
CPC .......... G06F 1/186; G06F 1/185; G06F 1/184; G06F 1/187; G06F 1/16; H05K 13/04; H05K 13/0486

USPC .................................................. 361/736, 737
See application file for complete search history.

(56) References Cited

U.S. PATENT DOCUMENTS

| | | | | |
|---|---|---|---|---|
| 5,544,006 A * | 8/1996 | Radloff | ................... | G06F 1/184 174/138 G |
| 6,538,879 B2 * | 3/2003 | Jiang | ....................... | G06F 1/187 211/26 |
| 7,057,898 B2 * | 6/2006 | Chen | ....................... | G06F 1/184 312/223.1 |

(Continued)

FOREIGN PATENT DOCUMENTS

| CN | 2261767 | 9/1997 |
|---|---|---|
| CN | 201159808 | 12/2008 |
| CN | 204205246 | 3/2015 |

*Primary Examiner* — James Wu
(74) *Attorney, Agent, or Firm* — Winston Hsu; Scott Margo

(57) ABSTRACT

A riser card rotating module is disposed adjacent to an expansion slot and includes a guide plate, a fixing plate, a riser card, a first pivot member and a second pivot member. The guide plate has a first guide rail parallel to a plug-unplug direction of the expansion slot and a second guide rail perpendicular to the plug-unplug direction of the expansion slot, wherein the first guide rail and the second guide rail communicate with each other to form a T-shape. The riser card is fixed on the fixing plate and has an electric connector. An end of the first pivot member is fixed on the fixing plate. Another end of the first pivot member is movably disposed on the guide plate. An end of the second pivot member is fixed on the fixing plate. Another end of the second pivot member is movably disposed on the guide plate.

10 Claims, 11 Drawing Sheets

(56) References Cited

U.S. PATENT DOCUMENTS

| | | | | |
|---|---|---|---|---|
| 7,577,000 | B2* | 8/2009 | Tsorng | G06F 1/185 361/801 |
| 8,804,359 | B2* | 8/2014 | Pang | G06F 1/185 361/760 |
| 8,961,214 | B2* | 2/2015 | Zhu | H01R 13/62 439/345 |
| 2008/0165487 | A1* | 7/2008 | Tsorng | G06F 1/185 361/737 |
| 2013/0119837 | A1* | 5/2013 | Gong | G06F 1/187 312/223.2 |
| 2013/0335911 | A1* | 12/2013 | Pang | G06F 1/185 361/679.32 |
| 2014/0106595 | A1* | 4/2014 | Zhu | H01R 13/62 439/345 |
| 2015/0062795 | A1* | 3/2015 | Zhu | G06F 1/187 361/679.31 |

* cited by examiner

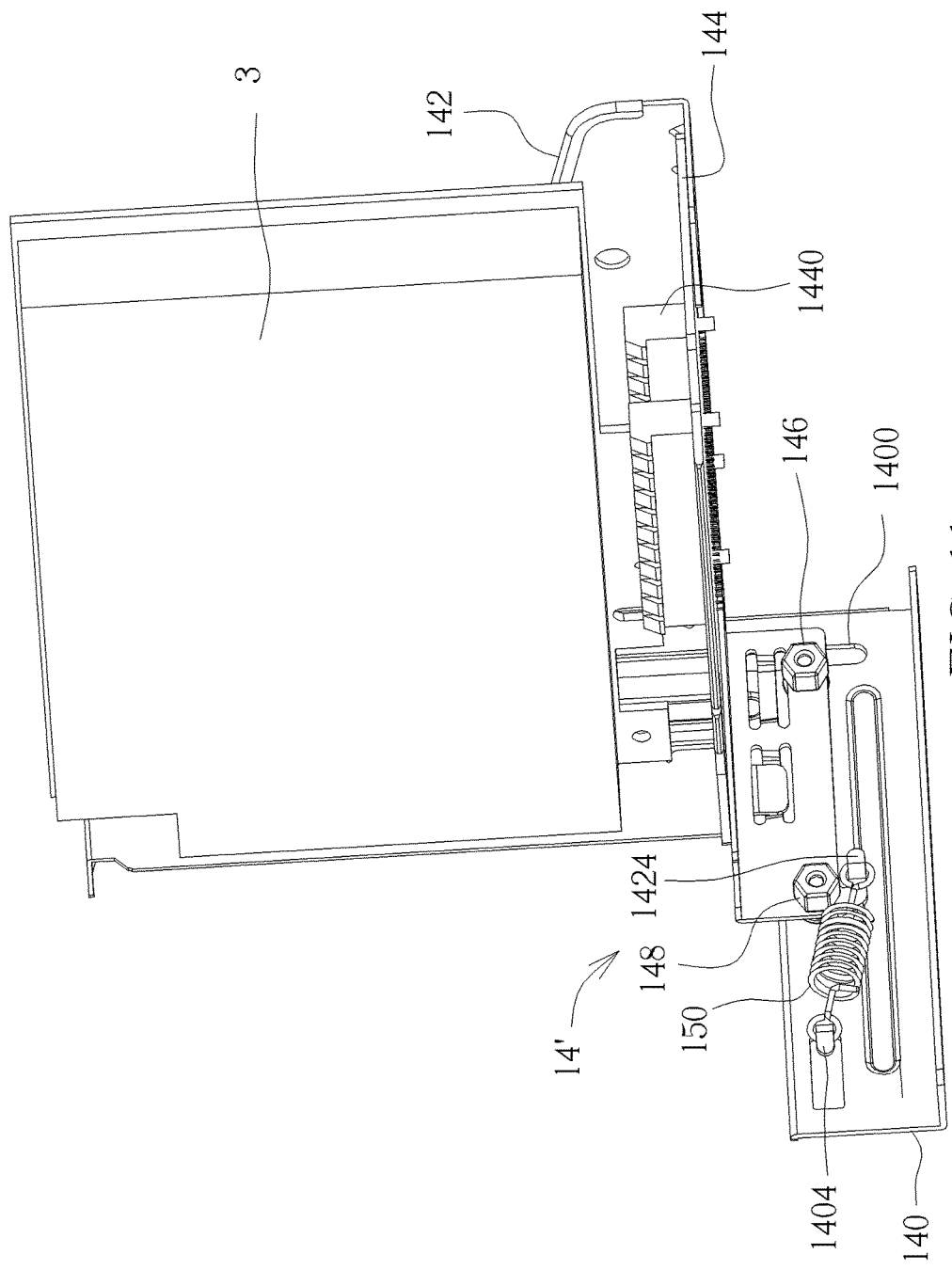

ELECTRONIC DEVICE AND RISER CARD ROTATING MODULE

BACKGROUND OF THE INVENTION

1. Field of the Invention

The invention relates to an electronic device and a riser card rotating module and, more particularly, to a riser card rotating module allowing an expansion card to be attached or detached conveniently and rapidly and an electronic device equipped with the riser card rotating module.

2. Description of the Prior Art

As technology advances and develops, computers are considered a necessity by a lot of people in their daily lives. To provide various functions for the computer, a main board of the computer usually has a plurality of expansion slots for installing a plurality of expansion cards such as sound card, graphics card, network card and so on, so as to enhance additional functions. However, as the computer function expands, the size of the expansion card also increases, such that the expansion cards installed in limited space may interfere with each other. At this time, a riser card can be inserted into the expansion card of the main board along a direction perpendicular to the main board and then the expansion card can be inserted into an adapter slot of the riser card along a direction parallel to the main board. Since the operation space in the computer casing is limited, it is inconvenient to attach/detach the expansion card to/from the riser card along the direction parallel to the main board.

SUMMARY OF THE INVENTION

The invention provides a riser card rotating module allowing an expansion card to be attached or detached conveniently and rapidly and an electronic device equipped with the riser card rotating module, so as to solve the aforesaid problems.

According to an embodiment of the invention, a riser card rotating module is disposed adjacent to an expansion slot and comprises a guide plate, a fixing plate, a riser card, a first pivot member and a second pivot member. The guide plate has a first guide rail and a second guide rail, wherein the first guide rail and the second guide rail communicate with each other to form a T-shape, the first guide rail is parallel to a plug-unplug direction of the expansion slot, and the second guide rail is perpendicular to the plug-unplug direction of the expansion slot. The riser card is fixed on the fixing plate and has an electric connector. An end of the first pivot member is fixed on the fixing plate and another end of the first pivot member is movably disposed on the guide plate. An end of the second pivot member is fixed on the fixing plate and another end of the second pivot member is movably disposed on the guide plate. When the electric connector of the riser card is inserted into the expansion slot, the first pivot member and the second pivot member are located in the first guide rail and located at opposite sides of the second guide rail. When the fixing plate drives the riser card to move away from the expansion slot to detach the electric connector from the expansion slot, the first pivot member and the second pivot member move away from the expansion slot along the first guide rail. When the second pivot member moves to an intersection of the first guide rail and the second guide rail, the second pivot member is capable of moving from the first guide rail into the second guide rail and driving the first pivot member to move toward the expansion slot along the first guide rail, so as to rotate the riser card.

According to another embodiment of the invention, an electronic device comprises a casing, a main board and a riser card rotating module. The casing has a back plate. The main board is disposed in the casing and has an expansion slot. The riser card rotating module is disposed in the casing and adjacent to the expansion slot. The riser card rotating module comprises a guide plate, a fixing plate, a riser card, a first pivot member and a second pivot member. The guide plate is fixed on the back plate. The guide plate has a first guide rail and a second guide rail, wherein the first guide rail and the second guide rail communicate with each other to form a T-shape, the first guide rail is parallel to a plug-unplug direction of the expansion slot, and the second guide rail is perpendicular to the plug-unplug direction of the expansion slot. The guide plate is located between the fixing plate and the back plate. The riser card is fixed on the fixing plate and has an electric connector. An end of the first pivot member is fixed on the fixing plate and another end of the first pivot member is movably disposed on the guide plate. An end of the second pivot member is fixed on the fixing plate and another end of the second pivot member is movably disposed on the guide plate. When the electric connector of the riser card is inserted into the expansion slot, the first pivot member and the second pivot member are located in the first guide rail and located at opposite sides of the second guide rail. When the fixing plate drives the riser card to move away from the expansion slot to detach the electric connector from the expansion slot, the first pivot member and the second pivot member move away from the expansion slot along the first guide rail. When the second pivot member moves to an intersection of the first guide rail and the second guide rail, the second pivot member is capable of moving from the first guide rail into the second guide rail and driving the first pivot member to move toward the expansion slot along the first guide rail, so as to rotate the riser card.

As mentioned in the above, when a user wants to attach/detach an expansion card to/from the riser card, the user needs to operate the fixing plate to drive the riser card to move away from the expansion slot to detach the electric connector from the expansion slot and then operates the fixing plate to drive the second pivot member to move from the first guide rail into the second guide rail and drive the first pivot member to move toward the expansion slot along the first guide rail, such that the riser card can be rotated from a state perpendicular to the main board to another state parallel to the main board. Accordingly, the user can attach/detach the expansion card to/from the riser card in a direction perpendicular to the main board conveniently and rapidly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 11 is a perspective view illustrating the fixing plate shown in FIG. 10 after rotating with 90 degrees.

DETAILED DESCRIPTION

Figure 1:
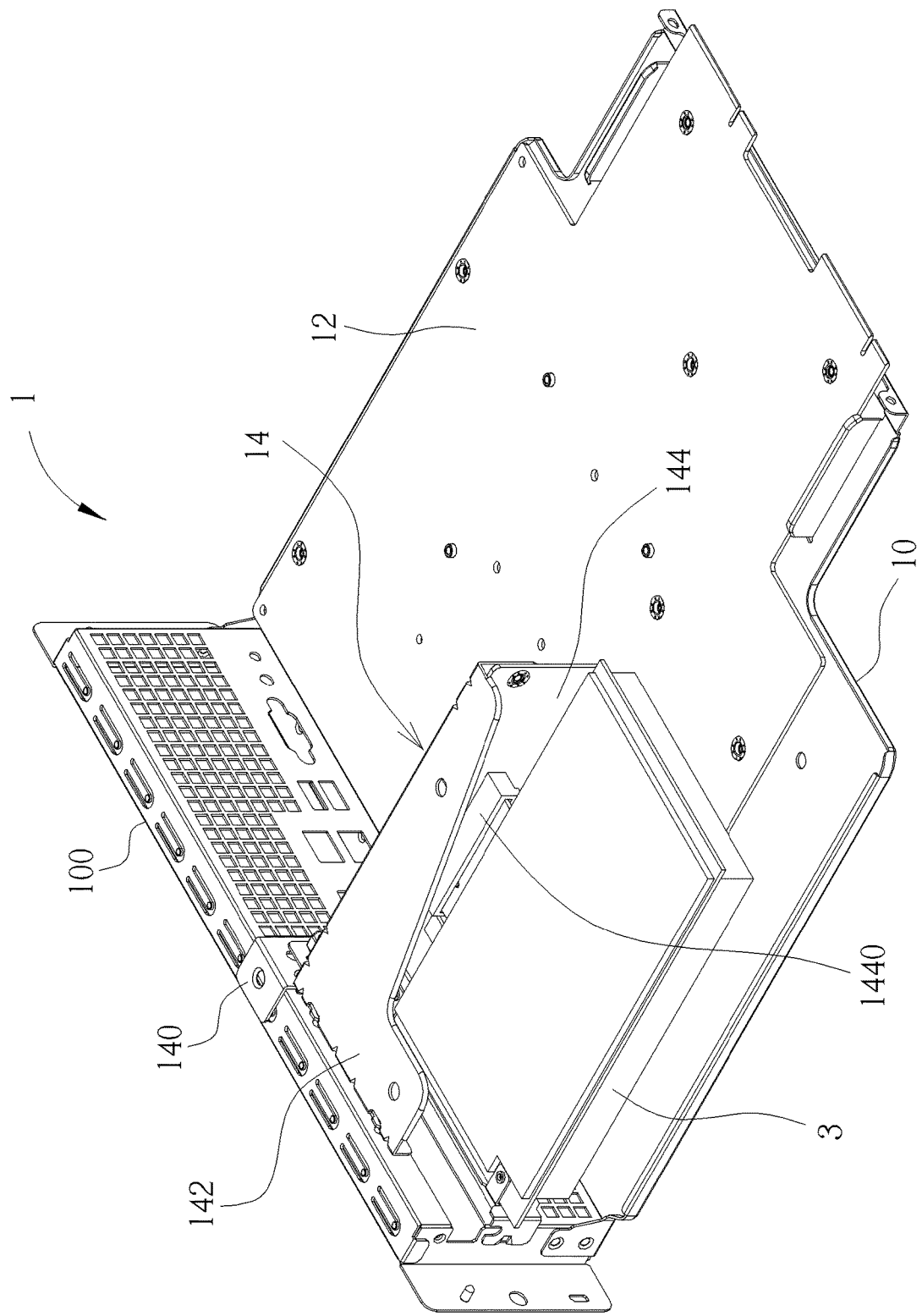
FIG. 1 is a perspective view illustrating parts of an electronic device according to an embodiment of the invention.
Figure 2:
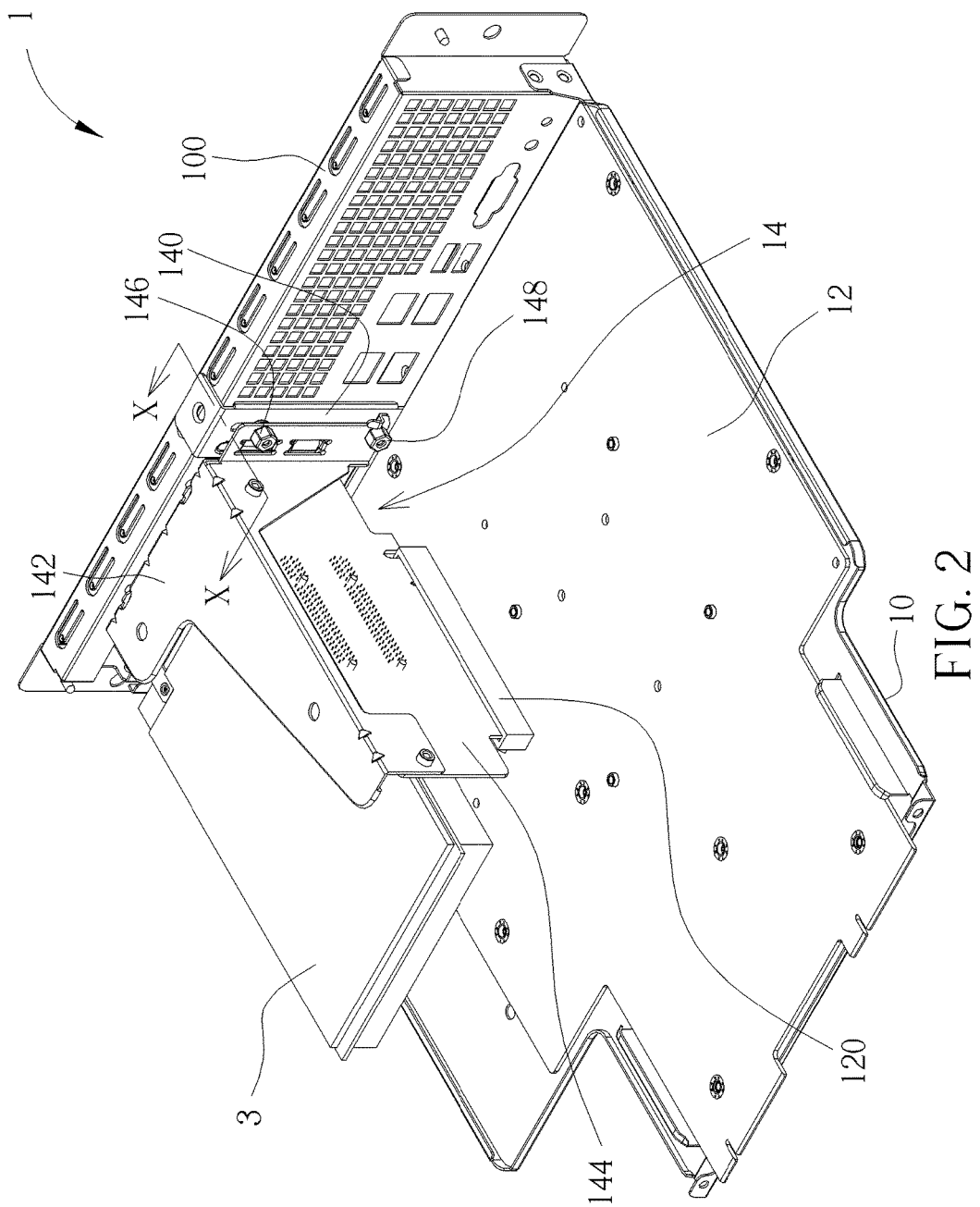
FIG. 2 is a perspective view illustrating the electronic device shown in FIG. 1 from another viewing angle.
Figure 3:
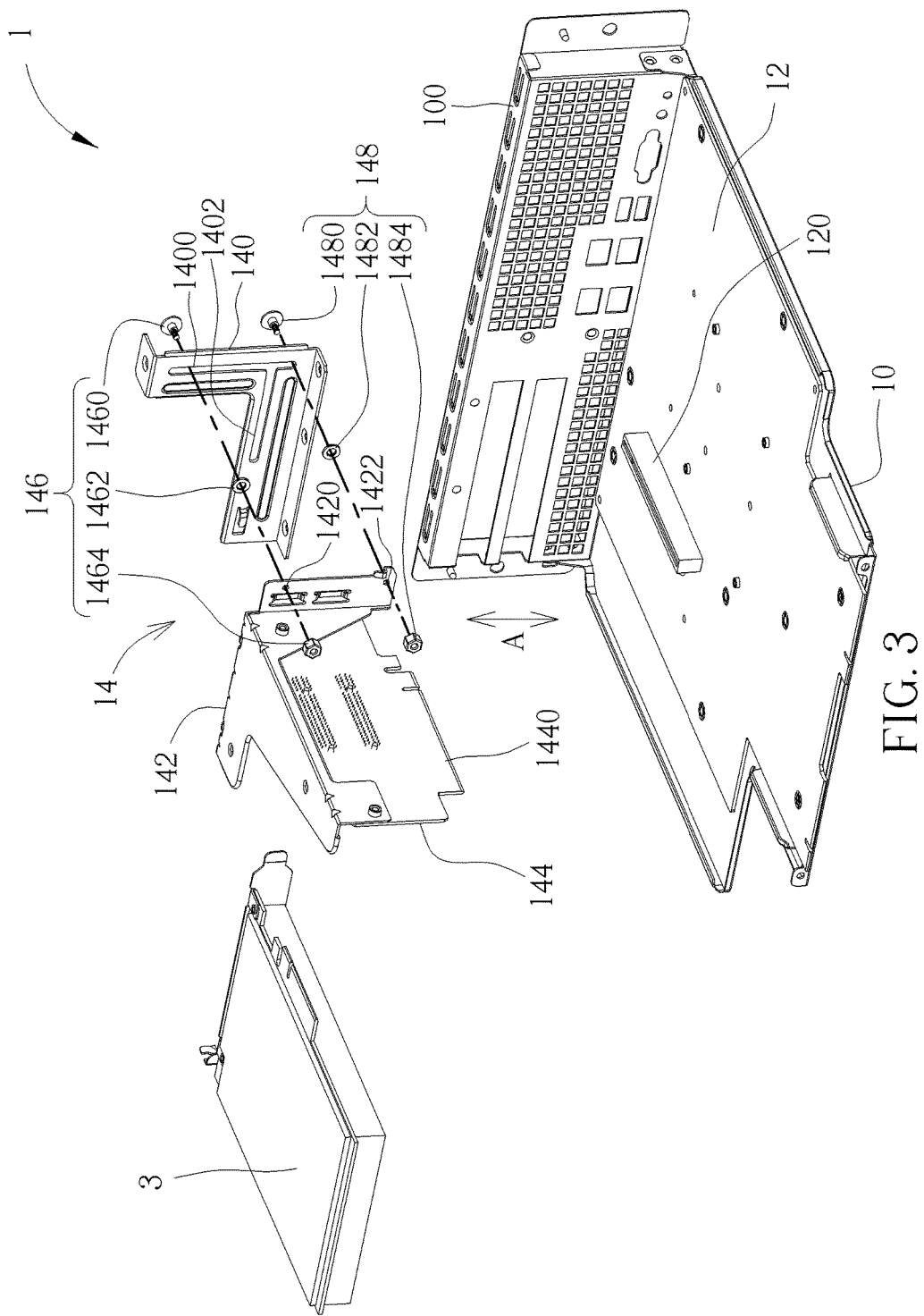
FIG. 3 is an exploded view illustrating the electronic device shown in FIG. 2.
Figure 4:
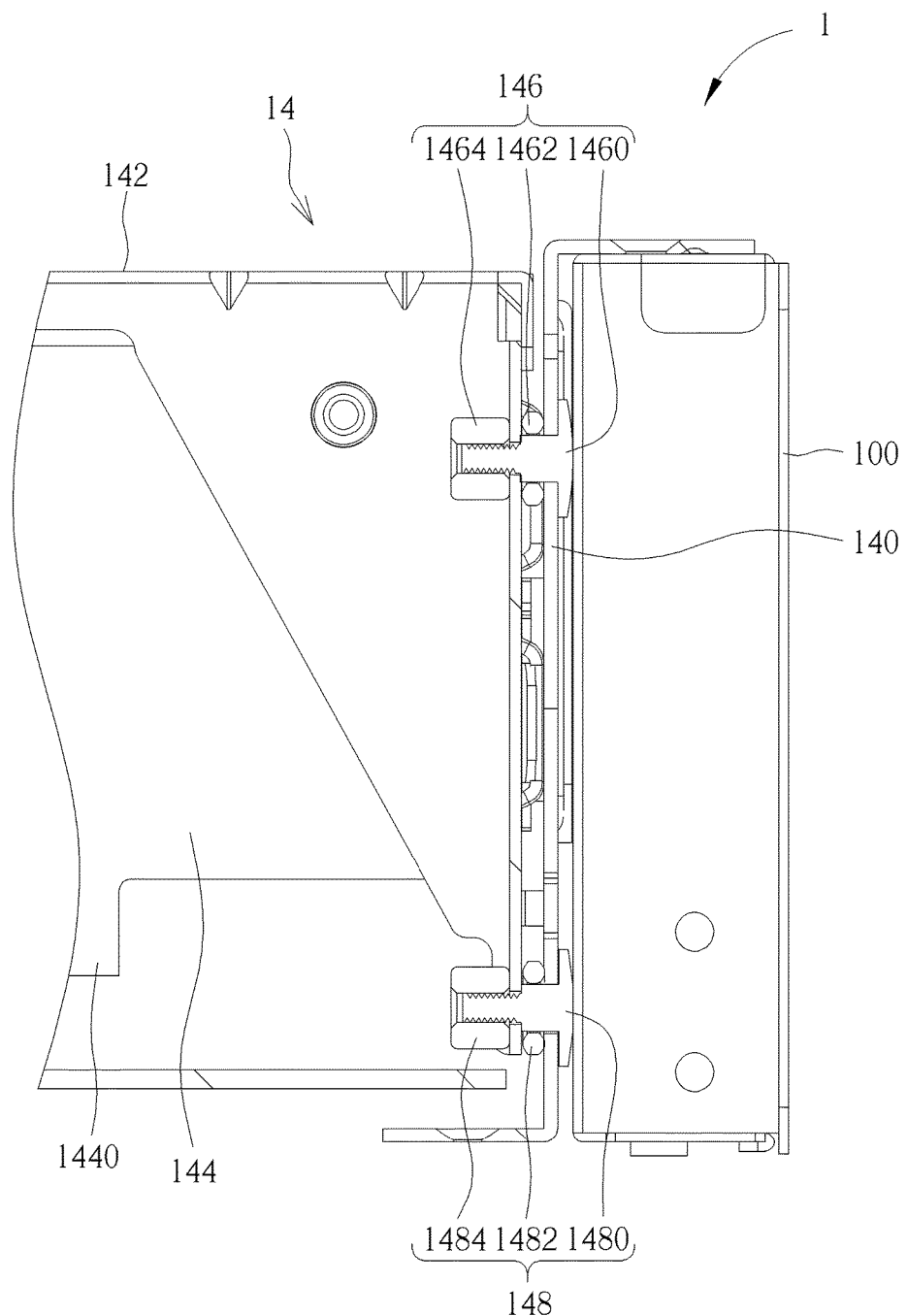
FIG. 4 is a sectional view illustrating the electronic device shown in FIG. 2 along line X-X.
Figure 5:
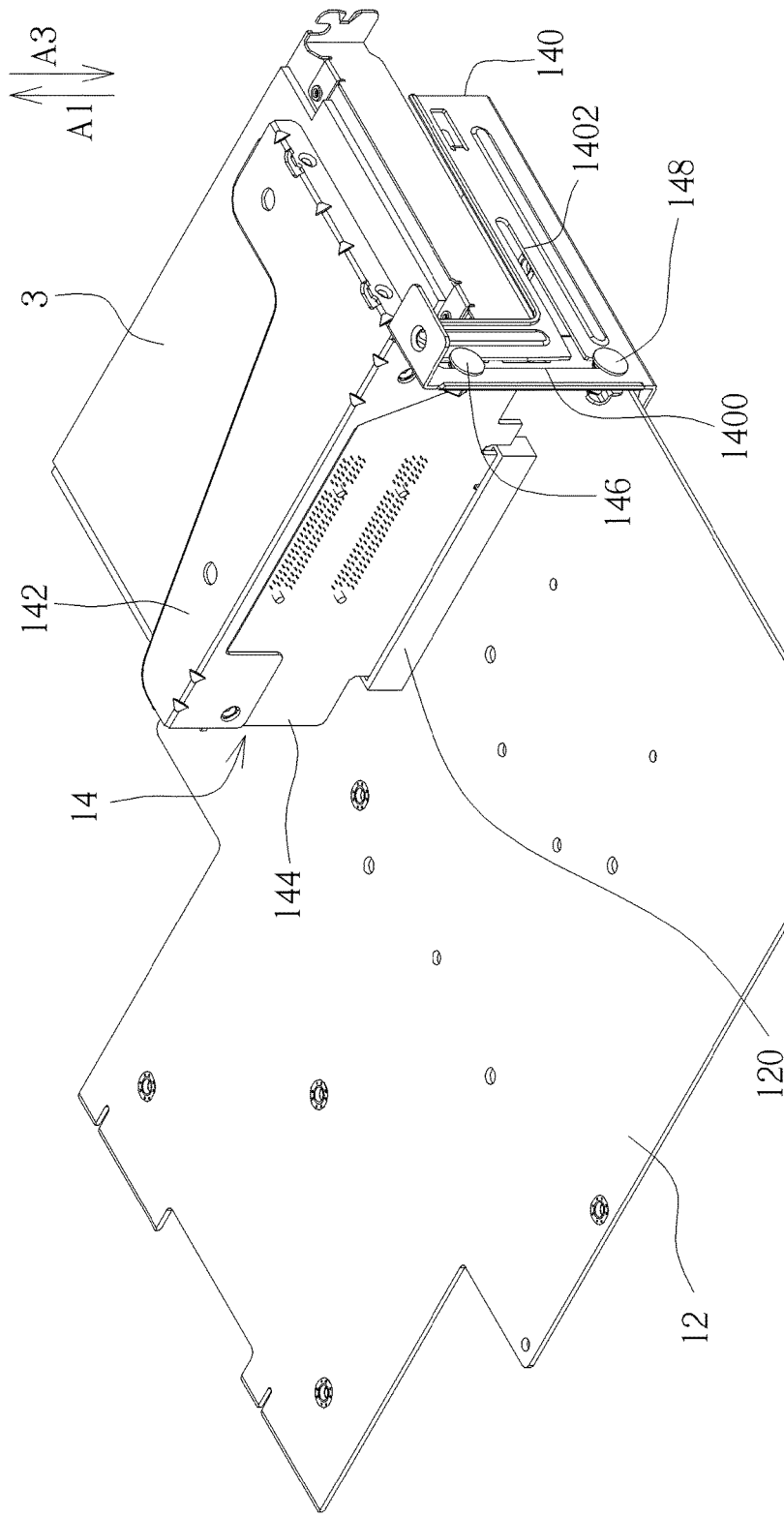
FIG. 5 is a perspective view illustrating the riser card rotating module and the main board shown in FIG. 2 from another viewing angle.
Figure 6:
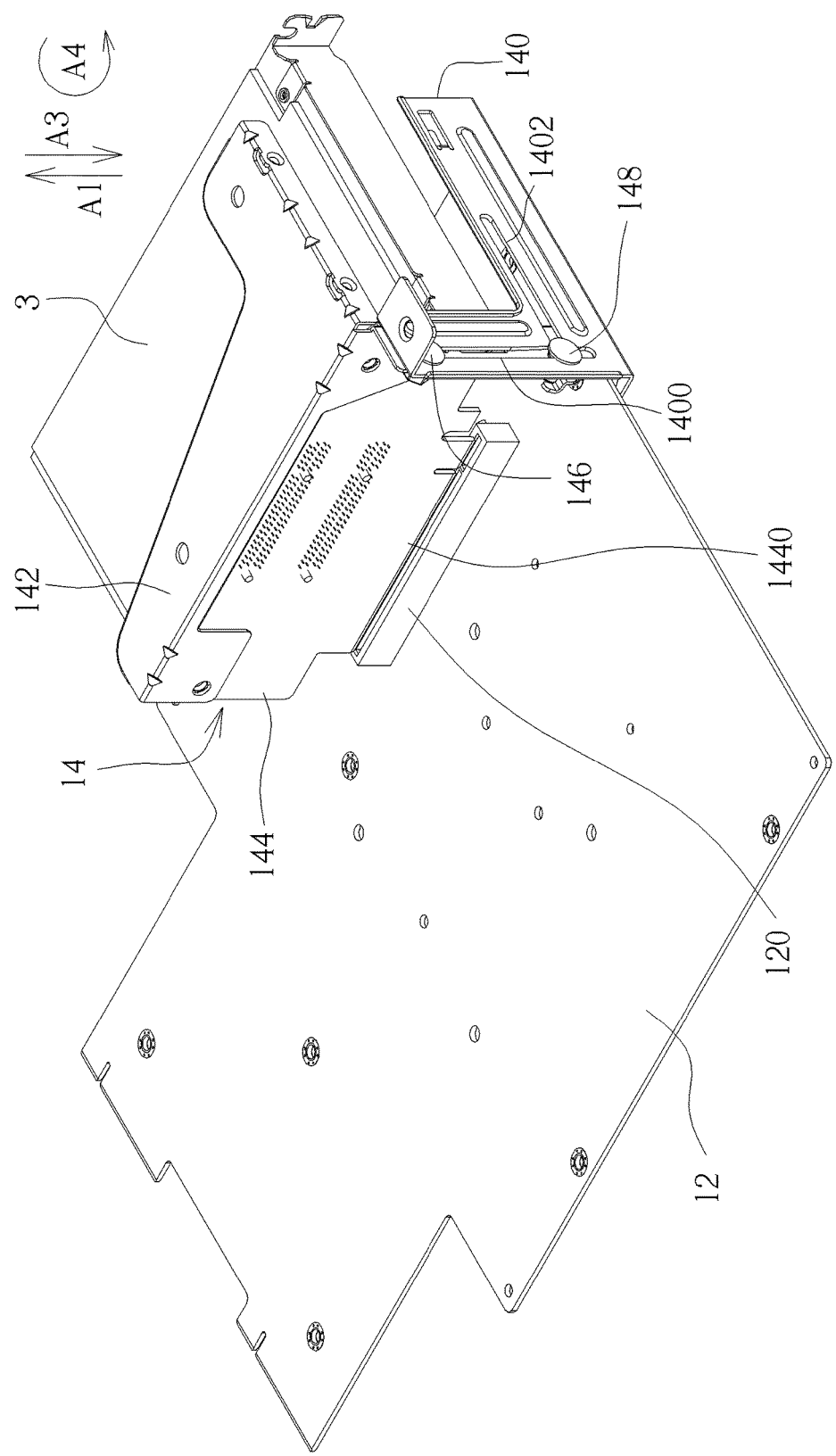
FIG. 6 is a perspective illustrating the fixing plate shown in FIG. 5 after moving along the first guide rail.
Figure 7:
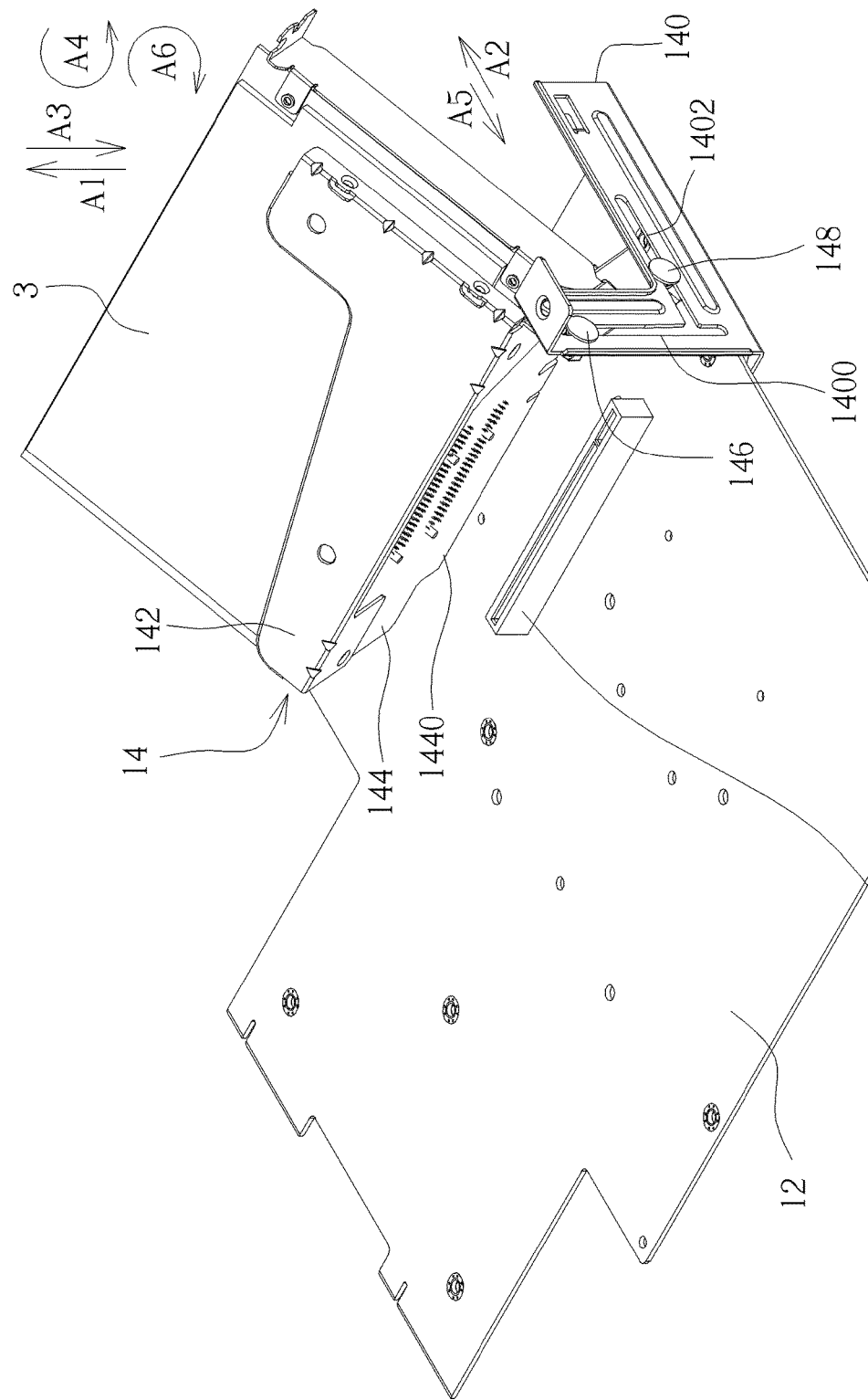
FIG. 7 is a perspective view illustrating the fixing plate shown in FIG. 6 during rotation.
Figure 8:
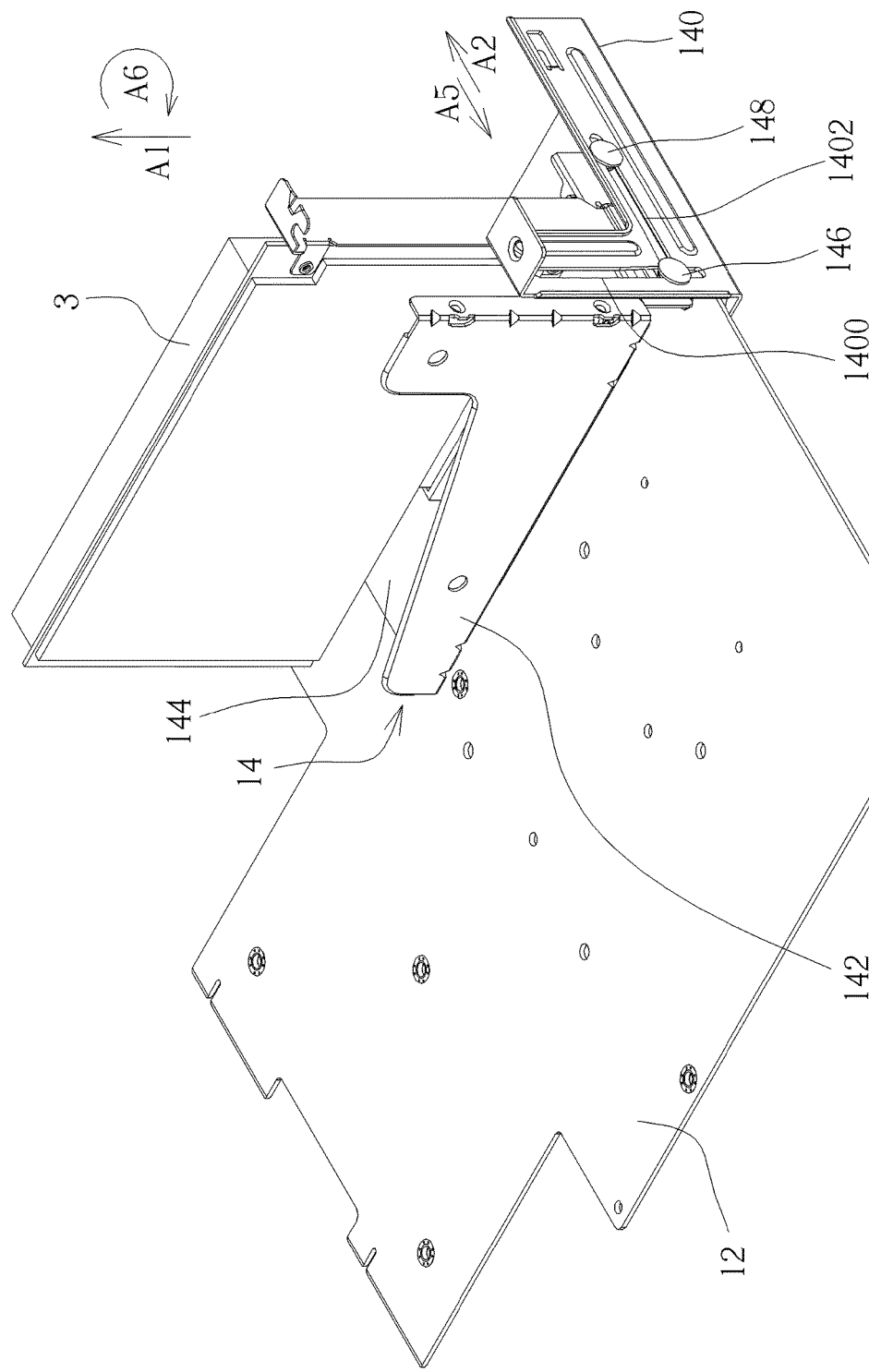
FIG. 8 is a perspective view illustrating the fixing plate shown in FIG. 7 after rotating with 90 degrees.
Figure 9:
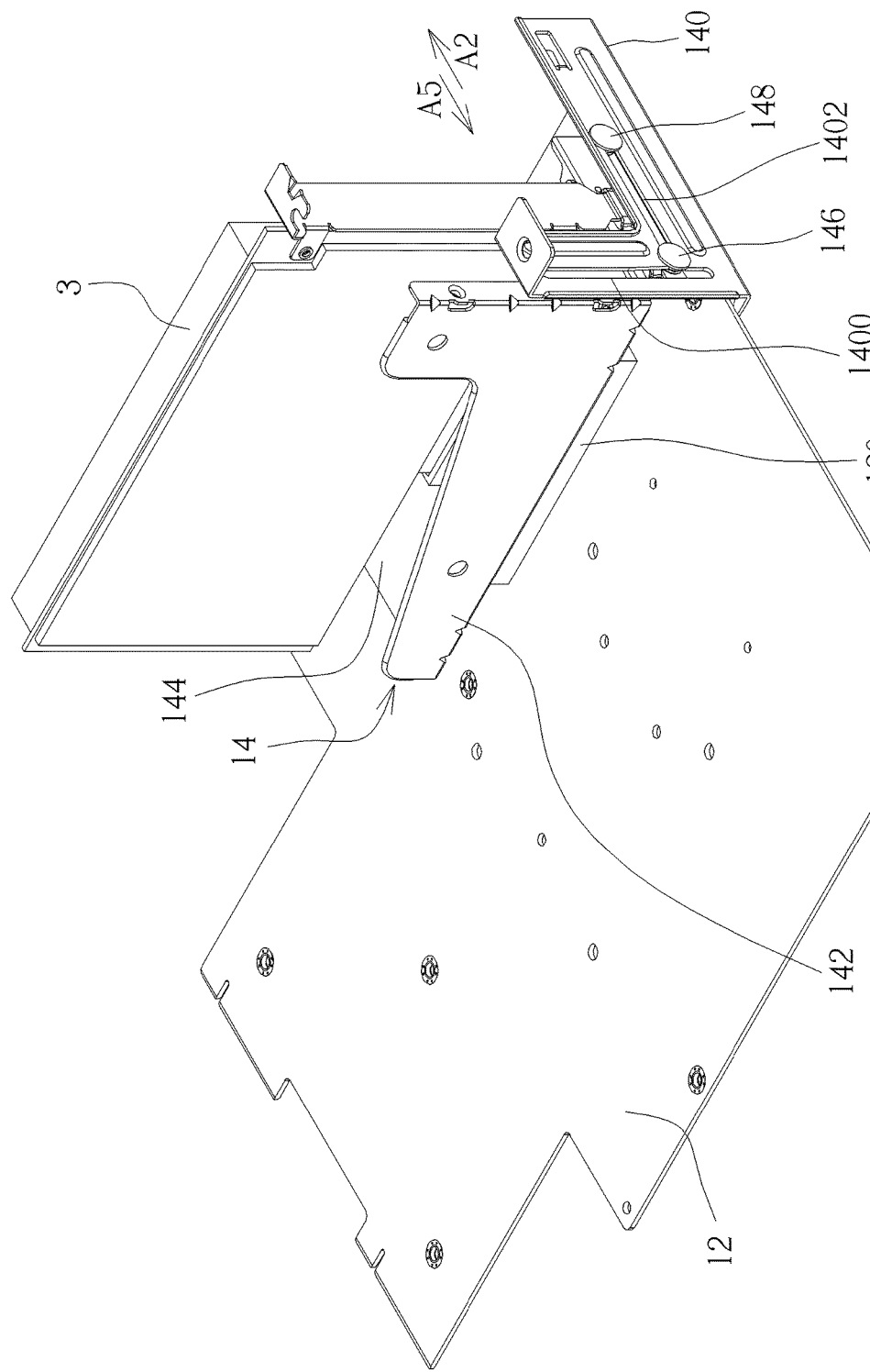
FIG. 9 is a perspective view illustrating the fixing plate shown in FIG. 8 after moving along the second guide rail.

Referring to FIGS. 1 to 9, FIG. 1 is a perspective view illustrating parts of an electronic device 1 according to an embodiment of the invention, FIG. 2 is a perspective view illustrating the electronic device 1 shown in FIG. 1 from another viewing angle, FIG. 3 is an exploded view illustrating the electronic device 1 shown in FIG. 2, FIG. 4 is a sectional view illustrating the electronic device 1 shown in FIG. 2 along line X-X, FIG. 5 is a perspective view illustrating the riser card rotating module 14 and the main board 12 shown in FIG. 2 from another viewing angle, FIG. 6 is a perspective illustrating the fixing plate 142 shown in FIG. 5 after moving along the first guide rail 1400, FIG. 7 is a perspective view illustrating the fixing plate 142 shown in FIG. 6 during rotation, FIG. 8 is a perspective view illustrating the fixing plate 142 shown in FIG. 7 after rotating with 90 degrees, and FIG. 9 is a perspective view illustrating the fixing plate 142 shown in FIG. 8 after moving along the second guide rail 1402.

As shown in FIGS. 1 to 3, the electronic device 1 comprises a casing 10, a main board 12 and a riser card rotating module 14. It should be noted that the casing 10 shown in FIGS. 1 to 3 is only a part of a complete casing of the electronic device 1. In practical applications, the electronic device 1 may be a computer, a server or other electronic devices equipped with the main board 12 and the riser card rotating module 14.

In this embodiment, the casing 10 has a back plate 100. The main board 12 is disposed in the casing 10 and has an expansion slot 120. The riser card rotating module 14 is dispose in the casing 10 and adjacent to the expansion slot 120. The riser card rotating module 14 comprises a guide plate 140, a fixing plate 142, a riser card 144, a first pivot member 146 and a second pivot member 148. The guide plate 140 is fixed on the back plate 100 and has a first guide rail 1400 and a second guide rail 1402, wherein the first guide rail 1400 and the second guide rail 1402 communicate with each other to form a T-shape, the first guide rail 1400 is parallel to a plug-unplug direction A of the expansion slot 120, and the second guide rail 1402 is perpendicular to the plug-unplug direction A of the expansion slot 120, as shown in FIG. 3.

An end of the first pivot member 146 is fixed on the fixing plate 142 and another end of the first pivot member 146 is movably disposed on the guide plate 140. An end of the second pivot member 148 is fixed on the fixing plate 142 and another end of the second pivot member 148 is movably disposed on the guide plate 140. In this embodiment, the first pivot member 146 may comprise a first screw 1460, a first washer 1462 and a first screw nut 1464 and the second pivot member 148 may comprise a second screw 1480, a second washer 1482 and a second screw nut 1484. Furthermore, the fixing plate 142 may have a first hole 1420 and a second hole 1422. To assemble the riser card rotating module 14, the first screw 1460 passes through the first guide rail 1400, the first washer 1462 and the first hole 1420 in sequence and the first screw nut 1464 is fixed on a thread end of the first screw 1460, such that the fixing plate 142 is clamped and fixed between a neck portion of the first screw 1460 and the first screw nut 1464, and a head portion of the first screw 1460 and the first washer 1462 are capable of sliding at opposite sides of the first guide rail 1400. Similarly, the second screw 1480 passes through the first guide rail 1400, the second washer 1482 and the second hole 1422 in sequence and the second screw nut 1484 is fixed on a thread end of the second screw 1480, such that the fixing plate 142 is clamped and fixed between a neck portion of the second screw 1480 and the second screw nut 1484, and a head portion of the second screw 1480 and the second washer 1482 are capable of sliding at opposite sides of the first guide rail 1400.

As shown in FIG. 4, after fixing the guide plate 140 on the back plate 100, the guide plate 140 is located between the fixing plate 142 and the back plate 100. Furthermore, the riser card 144 is fixed on the fixing plate 142 and has an electric connector 1440. In practical applications, the electric connector 1440 may be an edge connector (i.e. so-called gold finger), which can be inserted into the expansion slot 120 of the main board 12, so as to form electric connection. Moreover, as shown in FIG. 1, the riser card 144 further has adapter slots 1440 for receiving an expansion card 3, wherein the expansion card 3 may be a sound card, a graphics card, a network card and so on according to practical applications. It should be noted that the number of the adapter slots 1440 of the riser card 144 may be determined according to practical applications.

As shown in FIG. 5, when the electric connector 1440 of the riser card 144 is inserted into the expansion slot 120, the first pivot member 146 and the second pivot member 148 are located in the first guide rail 1400 and located at opposite sides of the second guide rail 1402. At this time, since the riser card 144 is fixed by the expansion slot 120, the first pivot member 146 and the second pivot member 148 cannot move along the first guide rail 1400. When a user wants to detach the expansion card 3 from the riser card 144 or attach another expansion card (not shown) to the riser card 144, the user can operate the fixing plate 142 to drive the riser card 144 to move away from the expansion slot 120 in a direction A1 (as shown in FIG. 6), so as to detach the electric connector 1440 from the expansion slot 120. As shown in FIG. 6, when the fixing plate 142 drives the riser card 144 to move away from the expansion slot 120 in the direction A1 to detach the electric connector 1440 from the expansion slot 120, the first pivot member 146 and the second pivot member 148 will move away from the expansion slot 120 along the first guide rail 1400 in the direction A1 simultaneously.

As shown in FIGS. 6 and 7, when the second pivot member 148 moves to an intersection of the first guide rail 1400 and the second guide rail 1402, the second pivot member 148 can move from the first guide rail 1400 into the second guide rail 1402 in a direction A2 and drive the first pivot member 146 to move toward the expansion slot 120 along the first guide rail 1400 in a direction A3, so as to rotate the riser card 144 in a direction A4. In this embodiment, since the first guide rail 1400 and the second guide rail 1402 communicate with each other to form the T-shape, i.e.

the first guide rail 1400 and the second guide rail 1402 are perpendicular to each other, the riser card 144 can be rotated with 90 degrees from a state perpendicular to the main board 12 (as shown in FIG. 6) to another state parallel to the main board 12 (as shown in FIG. 8).

When the second pivot member 148 moves along the second guide rail 1402 to drive the first pivot member 146 to move to the intersection of the first guide rail 1400 and the second guide rail 1402 (as shown in FIG. 8), the first pivot member 146 is capable of moving from the first guide rail 1400 into the second guide rail 1402. Accordingly, when the first pivot member 146 moves to the intersection of the first guide rail 1400 and the second guide rail 1402, the user can further operate the fixing plate 142 to drive the first pivot member 146 and the second pivot member 148 to move in the direction A2, such that the first pivot member 146 and the second pivot member 148 both are located in the second guide rail 1402, as shown in FIGS. 8 and 9. Since the first pivot member 146 and the second pivot member 148 both are located in the second guide rail 1402, the fixing plate 142 is restrained from moving in a direction perpendicular to the main board 12. At this time, the user can detach the expansion card 3 from the riser card 144 or attach another expansion card (not shown) to the riser card 144 in the direction perpendicular to the main board 12 conveniently and rapidly.

After detaching the expansion card 3 from the riser card 144 or attaching another expansion card (not shown) to the riser card 144, the user can operate the fixing plate 142 to drive the first pivot member 146 and the second pivot member 148 to move in the direction A5, such that the first pivot member 146 moves to the intersection of the first guide rail 1400 and the second guide rail 1402, as shown in FIGS. 8 and 9. When the first pivot member 146 moves to the intersection of the first guide rail 1400 and the second guide rail 1402, the first pivot member 146 is capable of moving away from the expansion slot 120 along the first guide rail 1400 in the direction A1 and driving the second pivot member 148 to move along the second guide rail 1402 in the direction A5, so as to rotate the riser card 144 in the direction A6, as shown in FIGS. 7 and 8. When the second pivot member 148 moves into the first guide rail 1400 along the second guide rail 1402, the user can push the fixing plate 142 toward the expansion slot 120 in the direction A3, so as to insert the electric connector 1440 of the riser card 144 into the expansion slot 120, as shown in FIGS. 5 and 6. Accordingly, the expansion card can be attached or detached easily.

Figure 10:
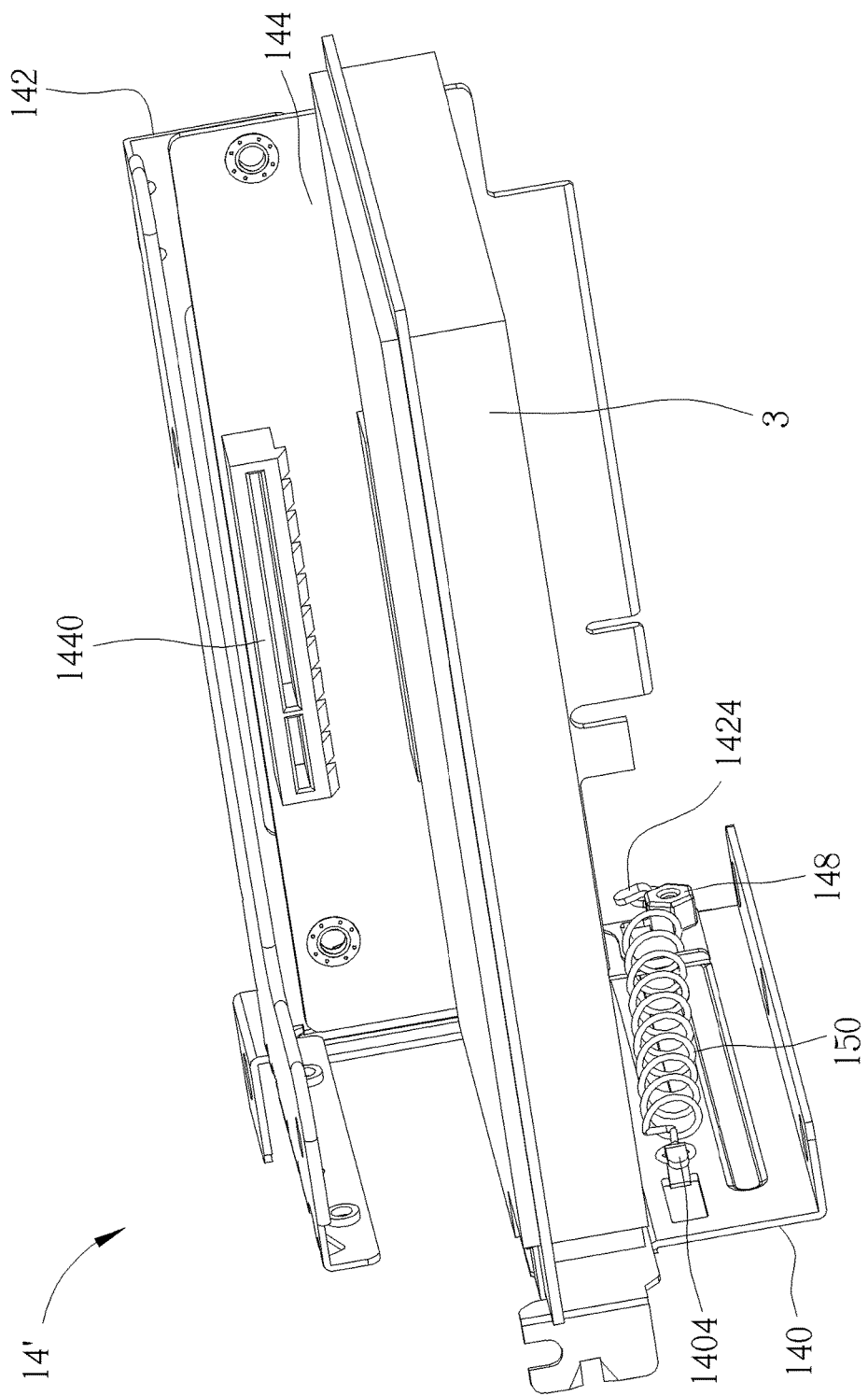
FIG. 10 is a perspective view illustrating a riser card rotating module according to another embodiment of the invention.

Referring to FIGS. 10 and 11, FIG. 10 is a perspective view illustrating a riser card rotating module 14' according to another embodiment of the invention and FIG. 11 is a perspective view illustrating the fixing plate 142 shown in FIG. 10 after rotating with 90 degrees. The main difference between the riser card rotating module 14' and the aforesaid riser card rotating module 14 is that the riser card rotating module 14' further comprises a resilient member 150, wherein opposite ends of the resilient member 150 are fixed on a fixing portion 1404 of the guide plate 140 and a fixing portion 1424 of the fixing plate 142. In this embodiment, the resilient member 150 may be an extension spring. When the first pivot member 146 and the second pivot member 148 are located in the first guide rail 1400 (as shown in FIG. 5), the resilient member 150 is stretched, as shown in FIG. 10. When the second pivot member 148 moves to the intersection of the first guide rail 1400 and the second guide rail 1402 (as shown in FIG. 6), an elastic force generated by the resilient member 150 will drive the second pivot member 148 to move into the second guide rail 1402, such that the riser card 144 will rotate with 90 degrees to the state shown in FIG. 11. In other words, the invention may further use the resilient member 150 to assist the riser card 144 in rotating more smoothly.

As mentioned in the above, when a user wants to attach/detach an expansion card to/from the riser card, the user needs to operate the fixing plate to drive the riser card to move away from the expansion slot to detach the electric connector from the expansion slot and then operates the fixing plate to drive the second pivot member to move from the first guide rail into the second guide rail and drive the first pivot member to move toward the expansion slot along the first guide rail, such that the riser card can be rotated from a state perpendicular to the main board to another state parallel to the main board. Accordingly, the user can attach/detach the expansion card to/from the riser card in a direction perpendicular to the main board conveniently and rapidly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A riser card rotating module disposed adjacent to an expansion slot, the riser card rotating module comprising:
   a guide plate having a first guide rail and a second guide rail, the first guide rail and the second guide rail communicating with each other to form a T-shape, the first guide rail being parallel to a plug-unplug direction of the expansion slot, the second guide rail being perpendicular to the plug-unplug direction of the expansion slot;
   a fixing plate;
   a riser card fixed on the fixing plate, the riser card having an electric connector;
   a first pivot member, an end of the first pivot member being fixed on the fixing plate, another end of the first pivot member being movably disposed on the guide plate; and
   a second pivot member, an end of the second pivot member being fixed on the fixing plate, another end of the second pivot member being movably disposed on the guide plate;
   wherein when the electric connector of the riser card is inserted into the expansion slot, the first pivot member and the second pivot member are located in the first guide rail and located at opposite sides of the second guide rail; when the fixing plate drives the riser card to move away from the expansion slot to detach the electric connector from the expansion slot, the first pivot member and the second pivot member move away from the expansion slot along the first guide rail; when the second pivot member moves to an intersection of the first guide rail and the second guide rail, the second pivot member is capable of moving from the first guide rail into the second guide rail and driving the first pivot member to move toward the expansion slot along the first guide rail, so as to rotate the riser card.

2. The riser card rotating module of claim 1, wherein when the second pivot member moves along the second guide rail to drive the first pivot member to move to the intersection of the first guide rail and the second guide rail, the first pivot member is capable of moving from the first guide rail into the second guide rail.

3. The riser card rotating module of claim 1, wherein the first pivot member comprises a first screw, a first washer and a first screw nut, the second pivot member comprises a second screw, a second washer and a second screw nut, and the fixing plate has a first hole and a second hole; the first screw passes through the first guide rail, the first washer and the first hole in sequence and the first screw nut is fixed on the first screw, such that the fixing plate is clamped and fixed between the first screw and the first screw nut, and the first screw and the first washer are capable of sliding at opposite sides of the first guide rail; the second screw passes through the first guide rail, the second washer and the second hole in sequence and the second screw nut is fixed on the second screw, such that the fixing plate is clamped and fixed between the second screw and the second screw nut, and the second screw and the second washer are capable of sliding at opposite sides of the first guide rail.

4. The riser card rotating module of claim 1, further comprising a resilient member, opposite ends of the resilient member being fixed on the guide plate and the fixing plate, respectively.

5. The riser card rotating module of claim 4, wherein when the first pivot member and the second pivot member are located in the first guide rail, the resilient member is stretched; when the second pivot member moves to the intersection of the first guide rail and the second guide rail, an elastic force generated by the resilient member drives the second pivot member to move into the second guide rail.

6. An electronic device comprising:
a casing having a back plate;
a main board disposed in the casing, the main board having an expansion slot; and
a riser card rotating module disposed in the casing and adjacent to the expansion slot, the riser card rotating module comprising:
  a guide plate fixed on the back plate, the guide plate having a first guide rail and a second guide rail, the first guide rail and the second guide rail communicating with each other to form a T-shape, the first guide rail being parallel to a plug-unplug direction of the expansion slot, the second guide rail being perpendicular to the plug-unplug direction of the expansion slot;
  a fixing plate, the guide plate being located between the fixing plate and the back plate;
  a riser card fixed on the fixing plate, the riser card having an electric connector;
  a first pivot member, an end of the first pivot member being fixed on the fixing plate, another end of the first pivot member being movably disposed on the guide plate; and
  a second pivot member, an end of the second pivot member being fixed on the fixing plate, another end of the second pivot member being movably disposed on the guide plate;
  wherein when the electric connector of the riser card is inserted into the expansion slot, the first pivot member and the second pivot member are located in the first guide rail and located at opposite sides of the second guide rail; when the fixing plate drives the riser card to move away from the expansion slot to detach the electric connector from the expansion slot, the first pivot member and the second pivot member move away from the expansion slot along the first guide rail; when the second pivot member moves to an intersection of the first guide rail and the second guide rail, the second pivot member is capable of moving from the first guide rail into the second guide rail and driving the first pivot member to move toward the expansion slot along the first guide rail, so as to rotate the riser card.

7. The electronic device of claim 6, wherein when the second pivot member moves along the second guide rail to drive the first pivot member to move to the intersection of the first guide rail and the second guide rail, the first pivot member is capable of moving from the first guide rail into the second guide rail.

8. The electronic device of claim 6, wherein the first pivot member comprises a first screw, a first washer and a first screw nut, the second pivot member comprises a second screw, a second washer and a second screw nut, and the fixing plate has a first hole and a second hole; the first screw passes through the first guide rail, the first washer and the first hole in sequence and the first screw nut is fixed on the first screw, such that the fixing plate is clamped and fixed between the first screw and the first screw nut, and the first screw and the first washer are capable of sliding at opposite sides of the first guide rail; the second screw passes through the first guide rail, the second washer and the second hole in sequence and the second screw nut is fixed on the second screw, such that the fixing plate is clamped and fixed between the second screw and the second screw nut, and the second screw and the second washer are capable of sliding at opposite sides of the first guide rail.

9. The electronic device of claim 6, wherein the riser card rotating module further comprises a resilient member and opposite ends of the resilient member are fixed on the guide plate and the fixing plate, respectively.

10. The electronic device of claim 9, wherein when the first pivot member and the second pivot member are located in the first guide rail, the resilient member is stretched; when the second pivot member moves to the intersection of the first guide rail and the second guide rail, an elastic force generated by the resilient member drives the second pivot member to move into the second guide rail.

* * * * *